(12) United States Patent
Ockenfuss

(10) Patent No.: US 9,099,626 B2
(45) Date of Patent: Aug. 4, 2015

(54) BROADBAND DIELECTRIC REFLECTORS FOR LED

(75) Inventor: Georg J. Ockenfuss, Santa Rosa, CA (US)

(73) Assignee: JDS Uniphase Corporation, Milpitas, CA (US)

(*) Notice: Subject to any disclaimer, the term of this patent is extended or adjusted under 35 U.S.C. 154(b) by 0 days.

(21) Appl. No.: 13/437,742

(22) Filed: Apr. 2, 2012

(65) Prior Publication Data

US 2013/0256720 A1  Oct. 3, 2013

(51) Int. Cl.
*H01L 21/336* (2006.01)
*H01L 33/60* (2010.01)
*H01L 33/46* (2010.01)
*H01L 33/64* (2010.01)

(52) U.S. Cl.
CPC ............... *H01L 33/60* (2013.01); *H01L 33/46* (2013.01); *H01L 33/641* (2013.01)

(58) Field of Classification Search
CPC ................................. H01L 21/336; G02B 1/10
USPC ......... 257/13, 81, 85, 88, 90, 94, 96, 98, 103, 257/918, E27.105, 79, 99
See application file for complete search history.

(56) References Cited

U.S. PATENT DOCUMENTS

| | | | |
|---|---|---|---|
| 6,833,565 B2 | 12/2004 | Su et al. | 257/98 |
| 2006/0292804 A1* | 12/2006 | Seo et al. | 438/287 |
| 2007/0217221 A1* | 9/2007 | Lee et al. | 362/612 |
| 2008/0037127 A1* | 2/2008 | Weber | 359/586 |
| 2011/0186874 A1 | 8/2011 | Shum | 257/88 |
| 2011/0267825 A1* | 11/2011 | Hotta et al. | 362/296.02 |

* cited by examiner

*Primary Examiner* — David Vu
*Assistant Examiner* — Mouloucoulaye Inoussa
(74) *Attorney, Agent, or Firm* — Matthew A. Pequignot; Pequignot + Myers LLC

(57) ABSTRACT

A broadband, omnidirectional, multi-layer, dielectric reflector for an LED in a white light emitting device provides both near 100% reflectivity across the visible spectrum of light, and electrical insulation between the substrate and the electrical circuitry used to power and control the LED. When a sealant material, having a higher index of refraction than air, is used to protect the LED and the accompanying electrical circuitry, an aluminum reflector layer or substrate is provided to make up for the loss of reflectivity at certain angles of incidence.

11 Claims, 13 Drawing Sheets

BROADBAND DIELECTRIC REFLECTORS FOR LED

CROSS-REFERENCE TO RELATED APPLICATIONS

The present invention does not claim priority.

TECHNICAL FIELD

The present invention relates to an all-dielectric reflector for a light emitting diode (LED), and in particular to a broadband, omnidirectional, multi-layer, all-dielectric reflector for an LED in a white light emitting device providing both reflectivity and electrical insulation.

BACKGROUND OF THE INVENTION

Conventional white light emitting devices, such as those disclosed in United States Patent Application 2011/0186874 published Aug. 4, 2011 in the name of Shum and illustrated in FIG. 1, include a blue or UV emitting LED 1 mounted on or surrounded by an electric circuit 2, which provides electrical connections to an outside power source to power the LED 1. A metallic reflective layer 3, e.g. silver, is disposed on a silicon substrate 4 for reflecting any stray light refracted or reflected by the LED package back in the desired direction. Accordingly, an isolation layer 6 is also required to provide electrical insulation between the electric circuit 2 and the metallic reflector layer 3. Nitrides or oxides, such as $Si_3N_4$ or $SiO_2$, are often used for the isolation layer 6 resulting in thicknesses of approximately 2 μm to 6 μm, depending on the legal requirements for the breakthrough voltages. Typically, the LED 1 is immersed in a light transmitting epoxy 7, which includes light converting dyes, e.g. phosphor, for converting the light emitted from the LED into a broad spectrum white light. Unfortunately, the silver reflective layer 3 is not environmentally stable over time and becomes tarnished, especially when exposed to high temperature and humidity, which greatly reduces the effective lifetime of the light emitting device.

The use of narrowband dielectric reflectors to reflect the particular wavelength of light emitted by the LED back through the phosphor material to maximize wavelength conversion has been disclosed in U.S. Pat. No. 6,833,565 issued Dec. 21, 2004 to Su et al; however, the problems of broadband, white light absorption/reflection and electrical isolation are not addressed.

An object of the present invention is to overcome the shortcomings of the prior art by providing a white-light emitting LED device in which a broadband, omnidirectional, multi-layer, dielectric reflector is used for providing both reflectivity and electrical insulation.

SUMMARY OF THE INVENTION

Accordingly, the present invention relates to a light emitting diode (LED) device comprising:
a substrate;
an LED for emitting light at a first wavelength;
electrical circuitry for providing power to the LED from external sources;
a wavelength conversion material covering the LED for converting light emitted at the first wavelength to light of at least a second wavelength, which combined with the light of the first wavelength forms a broadband light source; and
a multi-layer dielectric structure of alternating high and low index material layers in between the substrate and the LED providing both electrical insulation for the electrical connections and reflectivity for the broadband light source;
wherein the multi-layer dielectric structure is a broadband reflector reflecting at least 90% of the broadband light source over a bandwidth of at least 150 nm.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
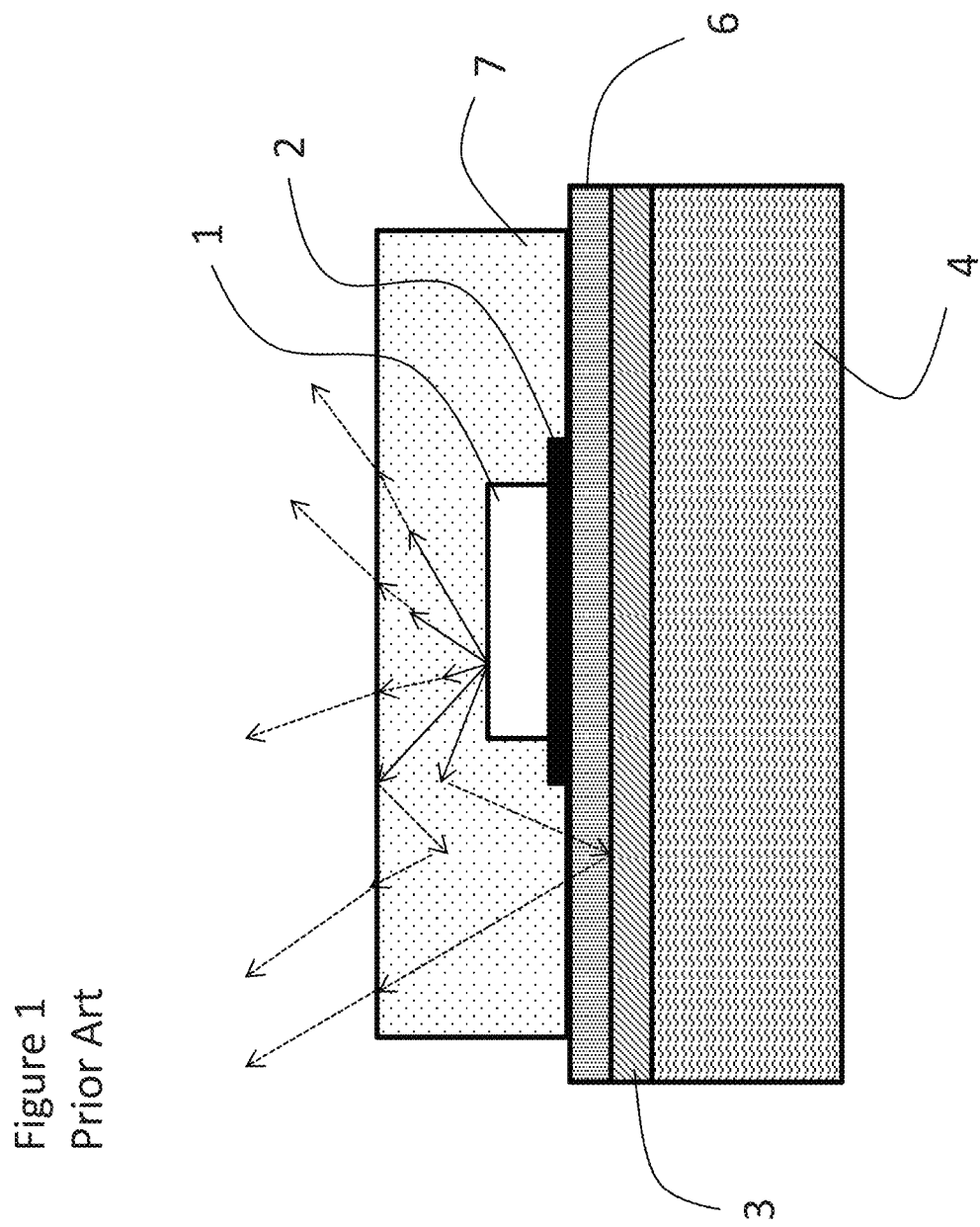
FIG. 1 is a cross-sectional view of a convention LED device.
Figure 2:
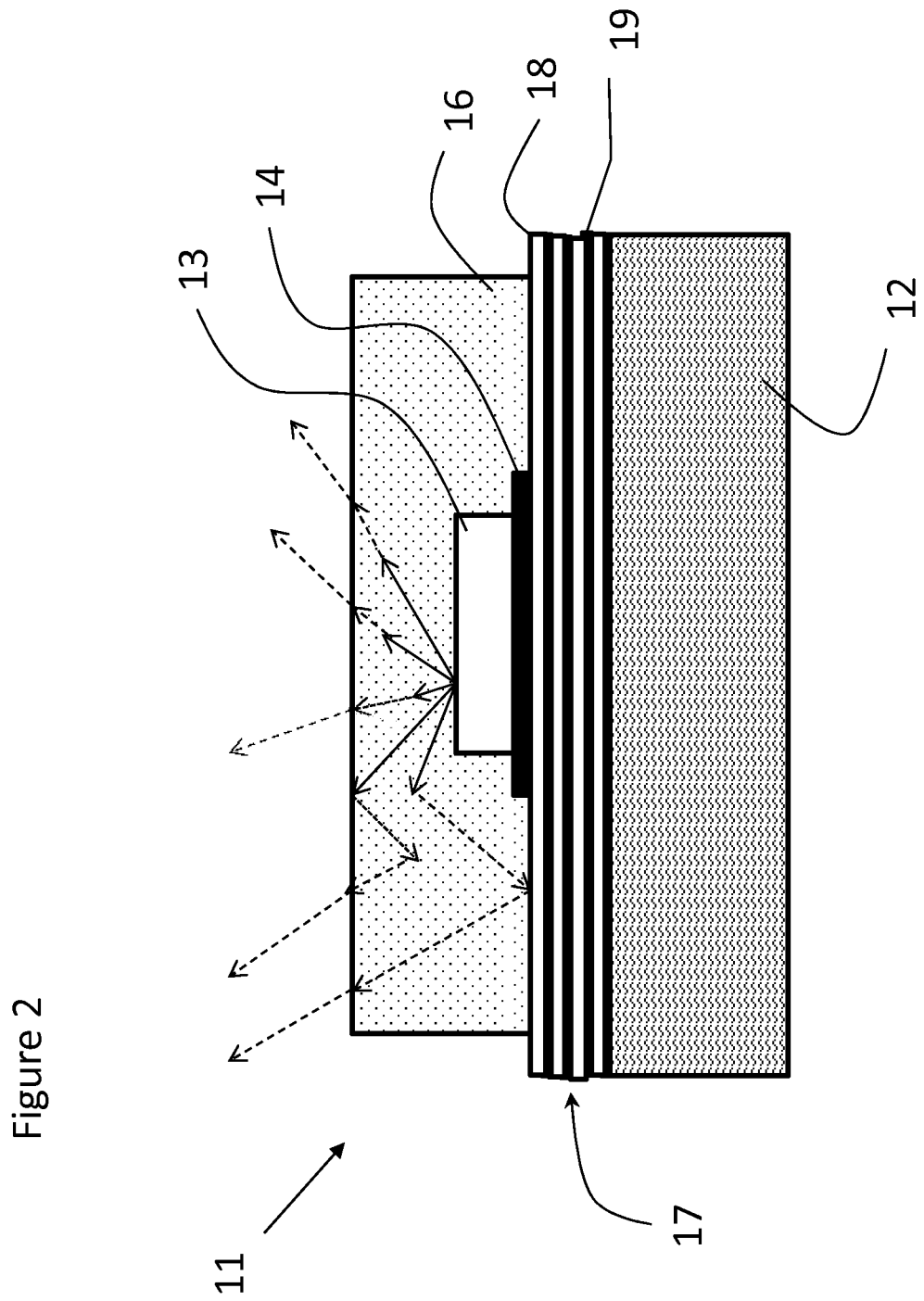
FIG. 2 is a cross-sectional view of an LED device according to the present invention.

With reference to FIG. 2, the present invention relates to a broadband, e.g. white, light emitting diode (LED) device, generally indicated at 11, including a substrate 12, typically formed of silicon or some other semiconductor material, glass (e.g. silica) or in a preferred embodiment, a metallic broadband reflective material, e.g. aluminum. One or more LED chips 13, e.g. a blue LED made of InGaN or GaN, are mounted on the substrate 12 for generating light in a first narrowband wavelength range, e.g. 50 nm, typically in the blue or ultra-violet (UV) range. Electronic circuitry 14, preferably in the form of conductive traces patterned in a conductive oxide layer, e.g. indium tin oxide, is formed around the LED 13 and electrically connected to external power and control sources to provide power and other control and monitoring functions to the LED 13.

In a preferred embodiment, the LED 13 and the electronic circuitry 14 are encapsulated in a transparent sealant material 16, e.g. silicone, which protects the LED 13 and the electronic circuitry 14. Additionally, the sealant material provides insulation and sealing for the electrical contacts and wires making up the electronic circuitry 14. Other types of material can be used, such as epoxy, glass, spin on glass, plastic, polymer, metal or semiconductor material.

In a preferred embodiment, the sealant material 16 includes polymers, which begin in a fluidic state for filling and sealing an interior region around the LED 13. The sealant material 16 is then cured to form a substantially stable state. The sealant material 16 is preferably optically transparent or can also be selectively transparent and/or translucent according to specific requirements. In addition, the sealant material 16, once cured, is substantially inert, and has a low absorption capability to allow a substantial portion of the electromagnetic radiation generated by the LED 11 to traverse therethrough.

The generation of white light involves passing the light at the initial wavelength, shown as a solid line in FIG. 2, from the LED(s) 11 through a medium including one or more different wavelength conversion materials, e.g. phosphors, creating different wavelengths, e.g. colors, of light, shown as dashed lines in FIG. 2, which combine to form white light. In a preferred embodiment, wavelength conversion is provided by materials that convert electromagnetic radiation absorbed by the wavelength conversion material. In a specific embodiment, the wavelength conversion material 16 is excited by the primary emission of the LED 13 and emits electromagnetic radiation of at least a second wavelength and optionally third and fourth wavelengths, as well.

In a preferred embodiment, the wavelength conversion material is incorporated into the sealant material 16, thereby surrounding and covering the LED 11 on five sides. In use, a fraction of the light from the LED 11 undergoes the Stokes shift, and is transformed from shorter wavelengths to longer wavelengths, and if several different phosphor materials of distinct colors are provided within the sealant material 16, the emitted spectrum is broadened even more, preferably to over 150 nm, more preferably over 200 nm, and even more preferably over 250 nm, effectively raising the color rendering index (CRI) value of a given LED.

As an example: a phosphor-based white LED device 11 according to the present invention includes an encapsulate InGaN or GaN blue LED 13 inside a phosphor coated epoxy 16, in which the phosphor is a common yellow phosphor material, such as cerium-doped yttrium aluminum garnet (Ce3+:YAG). Some of the original blue light (420 nm-490 nm) combines with the transformed yellow light (550 nm-600 nm) to appear as white light.

White LED devices 11 can also be formed using a near-ultraviolet (NUV) LED 11, generating UV light in the 350 nm to 400 nm range, with a sealant material 16 incorporating a mixture of high-efficiency europium-based phosphors that emit red and blue light, along with copper and aluminum-doped zinc sulfide (ZnS:Cu, Al) that emits green light. The generated red (620 nm to 700 nm), green (490 nm to 570 nm) and blue (420 nm to 490 nm) light combine to form a white light, as is well known in the art.

In other embodiments, the sealant material 16 can be doped or treated with other wavelength adjusting materials to selectively filter, disperse, or influence the original wavelength of light into one or more new wavelengths of light. As an example, the sealant material 16 can be treated with metals, metal oxides, dielectrics, or semiconductor materials, and/or combinations of these materials to convert the original wavelength to one or more different wavelengths of light with a much wider overall bandwidth, e.g. 150 nm or more, generating white light.

In alternate embodiments, phosphor particles may be deposited onto the LED 13 or the LED device 11. The phosphor particles may comprise any of the wavelength conversion materials listed above, or other materials known in the art. Typically, the phosphor particles may have a mean-grain-diameter particle size distribution between about 0.1 micron and about 50 microns. In some embodiments, the particle size distribution of phosphor particles is monomodal, with a peak at an effective diameter between about 0.5 microns and about 40 microns. In other embodiments, the particle size distribution of phosphor particles is bimodal, with local peaks at two diameters, trimodal, with local peaks at three diameters, or multimodal, with local peaks at four or more effective diameters.

In a specific embodiment, the entities comprises a phosphor or phosphor blend selected from $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include phosphors capable of emitting substantially red and/or green light. In various embodiments, an amount of phosphor material is selected based on the color balance of the blue LED devices.

To replace both the isolation layer 6 and the metallic reflector layer 3, the present invention utilizes a multi-layer dielectric stack 17 of alternating high and low index layers 18 and 19, respectively, designed to provide a broadband reflector, e.g. greater than 150 nm, preferably greater than 200 nm, and more preferably greater than 250 nm, and electrical isolation between the electronic circuitry 14 and the substrate 12. Ideally, the dielectric stack 17 reflects at least 90% of the light in the visible spectrum; however, somewhat smaller bandwidths are within the scope of the invention, e.g. 400 nm to 680 nm (240 nm wide) and 440 nm to 640 nm (200 nm wide).

Typically, the low index layers 19 are comprised of $SiO_2$, while the high index layers 18 are comprised of one or more of $Ta_2O_5$, $Nb_2O_5$, and $TiO_2$; however, other materials for both the high and low index layers 18 and 19 are within the scope of the invention.

In a first embodiment, the dielectric stack 17 is comprised of 4 or 5 sections, each section adapted to reflect light in a predetermined wavelength range, e.g. 75 nm to 125 nm, defined by a center wavelength, $\lambda_C$, which are spaced apart from other center wavelengths by approximately the same distance, e.g. 75 nm to 125 nm, so that there is a small overlap in bandwidth. Accordingly, each section is comprised of 8 to 20 layers of alternating high and low index material having a thickness approximately equal to a quarter wavelength of the center wavelength of the predetermined range.

For example: the first section of the dielectric stack 17 is comprised of 8 to 20 layers of alternating high and low index material, each layer having an optical thickness of $\lambda/4$ of $\lambda_{C1}$ (450 nm/4)=112.5 nm. For actual thickness divide the optical thickness by the refractive indices at these wavelengths.

The second section of the dielectric stack 17 is comprised of 8 to 20 layers of alternating high and low index material, each layer having an optical thickness of λ/4 of $\lambda_{C2}$=(550 nm/4)=137.5 nm.

The third section of the dielectric stack 17 is comprised of 8 to 20 layers of alternating high and low index material, each layer having an optical thickness of λ/4 of $\lambda_{C3}$=(650 nm/4) =162.5 nm.

The fourth section of the dielectric stack 17 is comprised of 8 to 20 layers of alternating high and low index material, each layer having an optical thickness of λ/14 of $\lambda_{C4}$=(750 nm/4) =187.5 nm.

Figure 3:
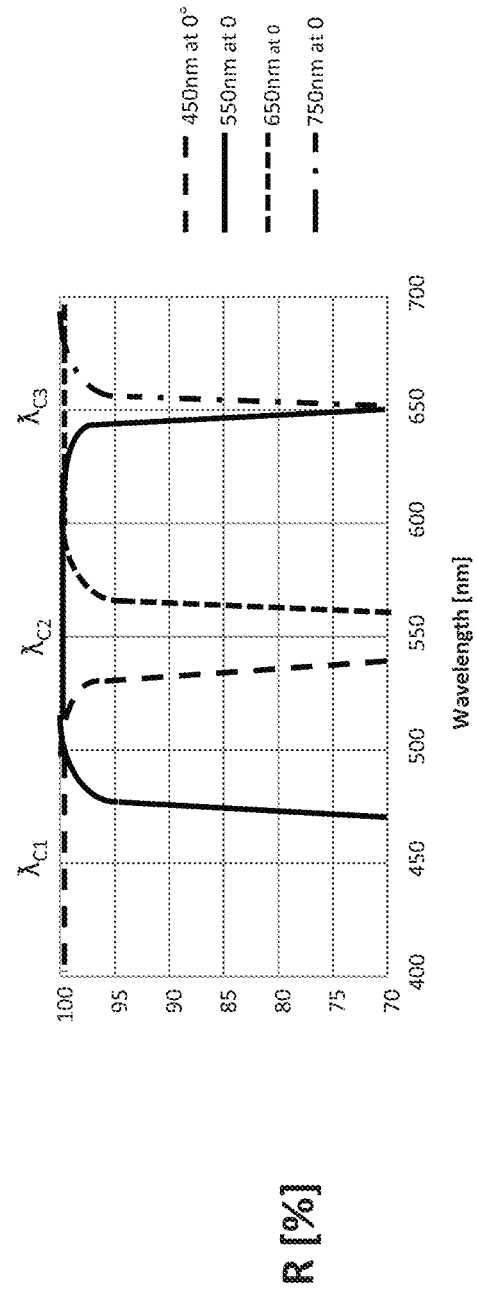
FIG. 3 is a plot of reflectance vs wavelength with a zero angle of incidence for four wavelength stacks having center wavelengths spaced 100 nm apart.
Figure 4:
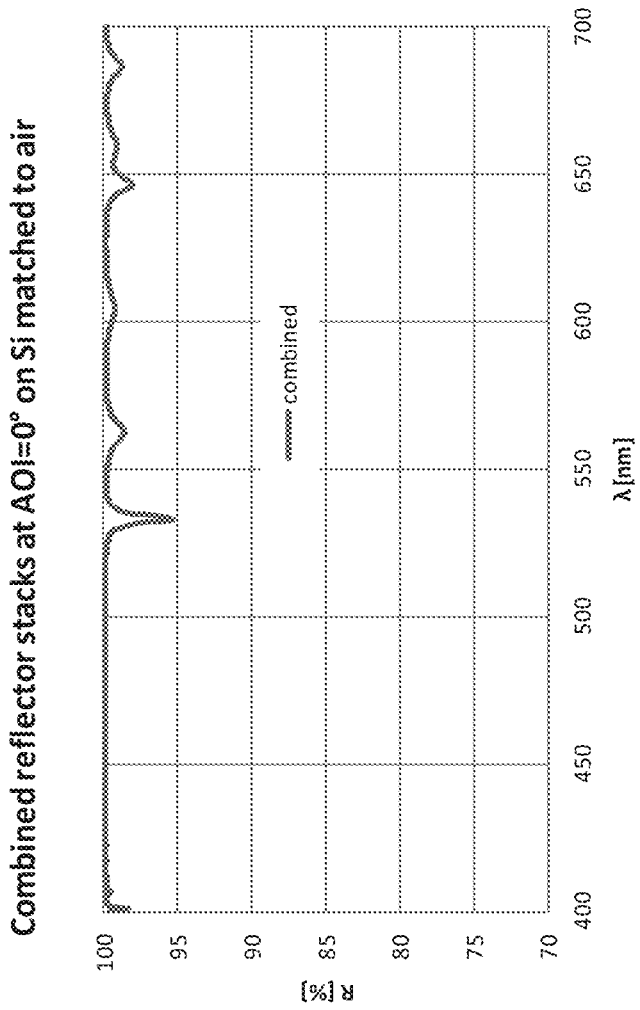
FIG. 4 is a plot of reflectance vs wavelength with a zero angle of incidence for a combined wavelength stack according to a first embodiment of the present invention including four sections having reflectance bandwidths defined by center wavelengths spaced 100 nm apart.

FIG. 3 is a plot of reflectance vs wavelength for a LED device 11 with a silicon substrate 12, but without any sealant material 16, i.e. emitting into the air, at a zero degree angle of incidence. The four overlapping reflectance bandwidths for the four aforementioned sections of the dielectric stack 17 defined by the center wavelengths $\lambda_{C1}$, $\lambda_{C2}$, $\lambda_{C3}$, and $\lambda_{C4}$ (not shown) are illustrated. FIG. 4 is also a plot of reflectance vs wavelength, illustrating the combined broadband reflectance bandwidth for the combined dielectric stack 17, including the plurality of sections as hereinbefore described. Accordingly, the dielectric stack 17 provides 95% to 100% reflectance for a broadband spectrum of light (over 300 nm) emitted into air at a zero degree angle of incidence.

Figure 5:
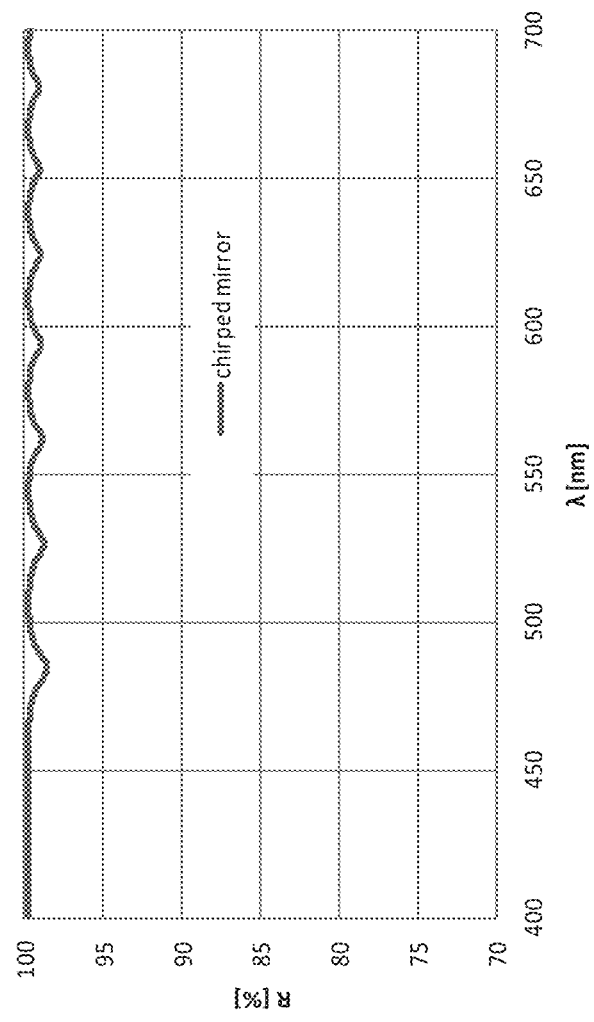
FIG. 5 is a plot of reflectance vs wavelength with a zero angle of incidence for a combined wavelength stack according to a second embodiment of the present invention including approximately fifty high and low index pairs having reflectance bandwidths defined by center wavelengths spaced 10 nm apart.

In an alternative embodiment of the present invention, the dielectric stack 17 can be formed from twenty to fifty different sections, e.g. only one or two pairs of alternating high and low index layers, each pair adapted to reflect a relatively narrow bandwidth, e.g. 10 nm to 25 nm, defined by a center-wavelength. Accordingly, the dielectric stack 17 could include quarter wavelength pairs for reflectance bandwidths centered at 350 nm, 360 nm, 370 nm, . . . 820 nm, 830 nm, and 840 nm or some smaller subset thereof. The optical thickness of each layer would be the center wavelength divided by four ($\lambda_C/4$). FIG. 5 is a plot of wavelength vs reflectance, and illustrates the combined reflectance bandwidth for the aforementioned example for an LED device 11 with a silicon substrate 12, without sealant material 16 at a zero degree angle of incidence. The second embodiment provides from 98% to 100% reflectivity for a broadband spectrum of light (over 300 nm from 400 nm to 700 nm) emitted into air at a zero angle of incidence.

The aforementioned designs are typically optimized using thin film design software. Examples of commercially available thin film design software are 'Escential Mcleod', Filmstare, TfCalc, Optilayer. The number of layers needed depends on the difference in refractive indices between the high-index and low-index material. The larger the difference the fewer layers are required.

The total height of the dielectric stack 17 can be in the range of 2 μm to 20 μm, preferably 2.5 μm to 15 μm, and most preferably between 7 μm and 12 μm, providing over 90% reflectivity, preferable over 92.5% reflectivity, for light from 400 nm to 680 nm at angles of incidence between 0° and 90°.

Figure 6A:
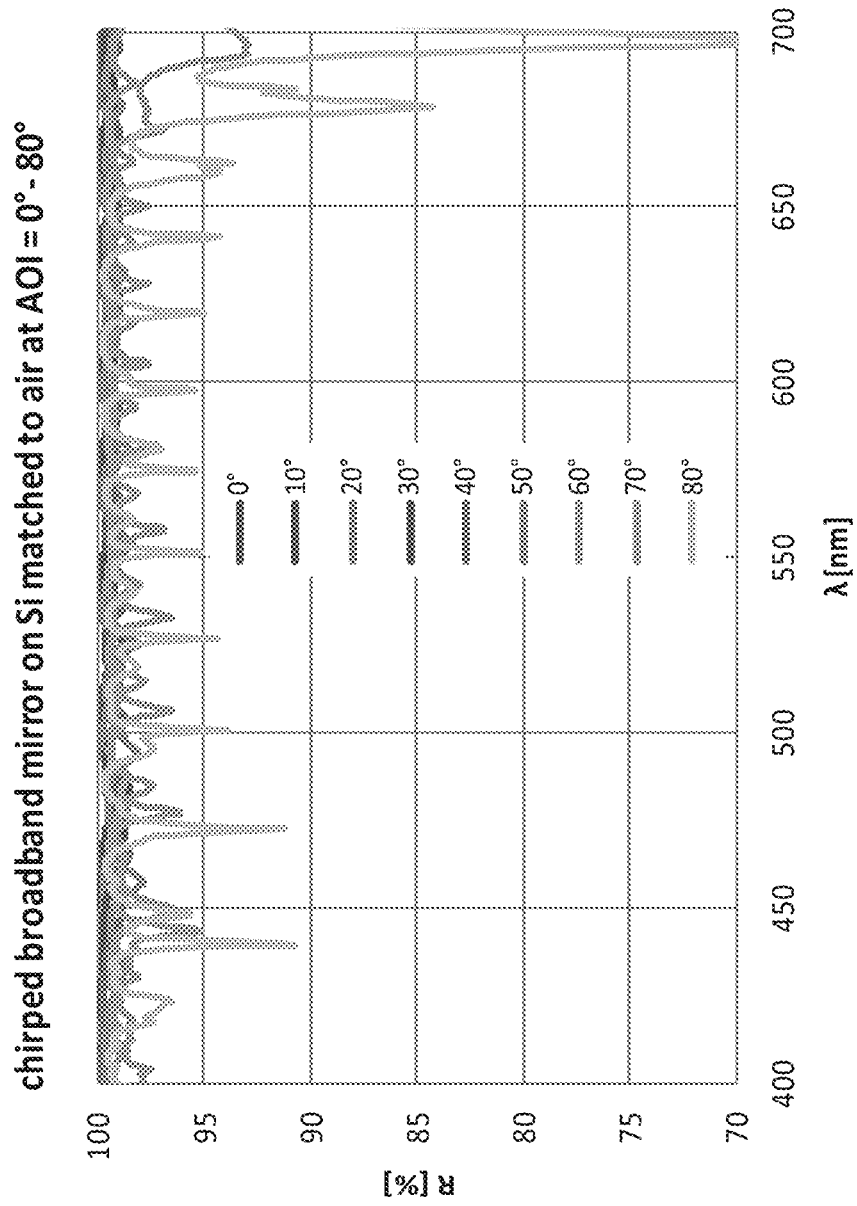
FIG. 6a is a plot of reflectance vs wavelength for the wavelength stack of the second embodiment at a plurality of different angles of incidence.
Figure 6B:
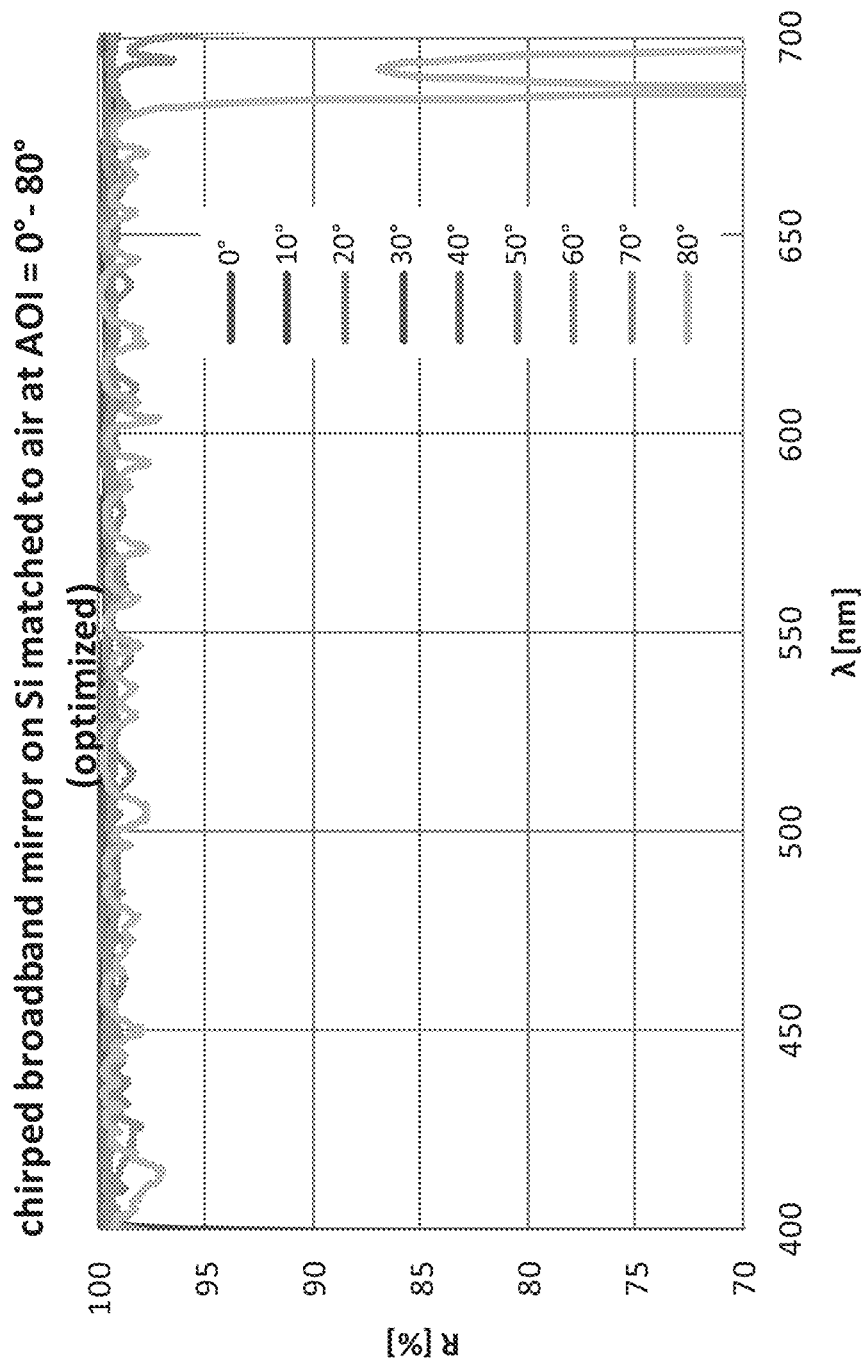
FIG. 6b is a plot of reflectance vs wavelength for an optimized wavelength stack of the second embodiment at a plurality of different angles of incidence.
Figure 7:
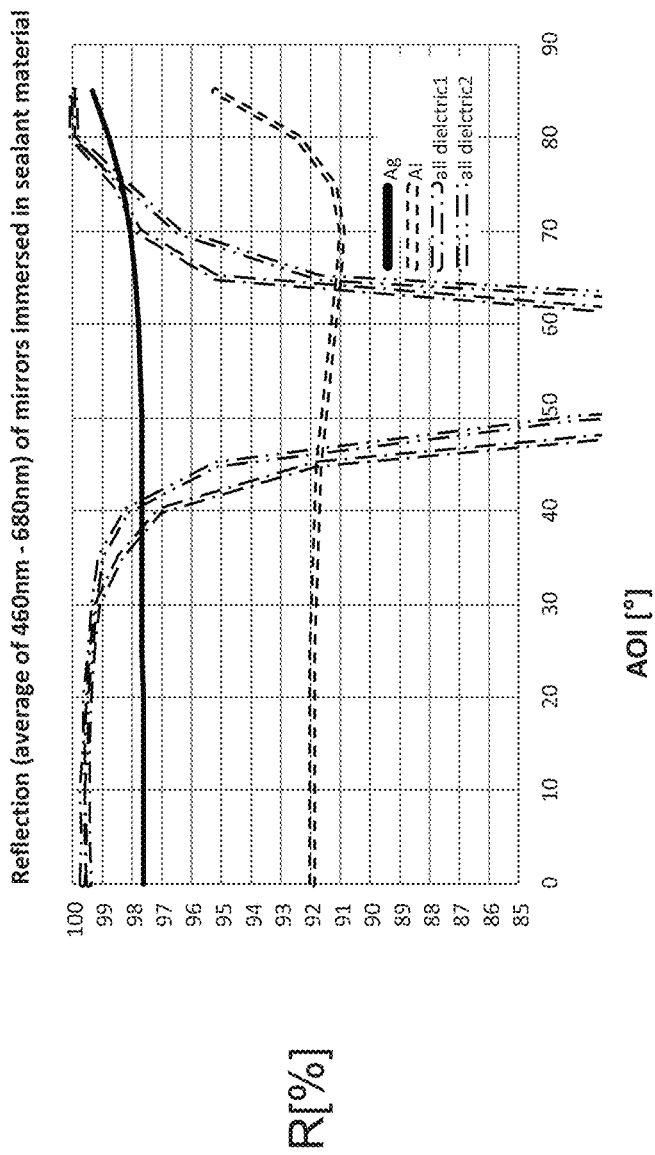
FIG. 7 is a plot of average reflectance over a range of 400 nm to 680 nm vs angle of incidence comparing metallic reflectors, e.g. silver and aluminum, to the all dielectric reflectors in accordance with the present invention.

None of the aforementioned designs in FIGS. 4 to 6a were optimized using the software as described above, i.e. the final design will not be a simple stack of layers with optical widths that are exactly a quarter wavelength of the center wavelength; however, the designs illustrated from FIG. 7 on have been 'optimized'.

As illustrated in FIG. 6a, the angle of incidence plays a factor in the overall reflectivity of the dielectric stack 17. At several wavelengths in the visible spectrum and at various angles of incidence the reflectivity is reduced by 5%, and at a few wavelengths and angles of incidence the reflectivity is reduced by 10% to 15% or more for the aforementioned example of an LED device 11 with a silicon substrate 12, without sealant material 16. The spikes can be removed by optimization, as illustrated in FIG. 6b, in which the reflectivity reductions at large and small angles of incidence are greatly reduced, providing over 95% reflectivity at all angles and wavelengths between 400 nm and 675 nm.

When the sealant material 16, with an index of refraction, e.g. 1.5, higher than air (1.0), is included in the LED device 11, there is a distinct reduction in reflectivity at certain angles of incidence, e.g. 45° to 65°, as illustrated in FIG. 7, which is a plot of the angle of incidence (AOI) vs reflectivity. The main reason for the drastic decrease in reflectivity is an increase in the splitting of the polarized s and p components of the light at the aforementioned angles. At a certain angle, i.e. the Brewster angle, while the s polarized light is reflected all of the p polarized light is being transmitted, and in the case of the LED device 11, lost due to absorption of the substrate 12 or transmitted out the backside of the LED device 11.

Figure 8:
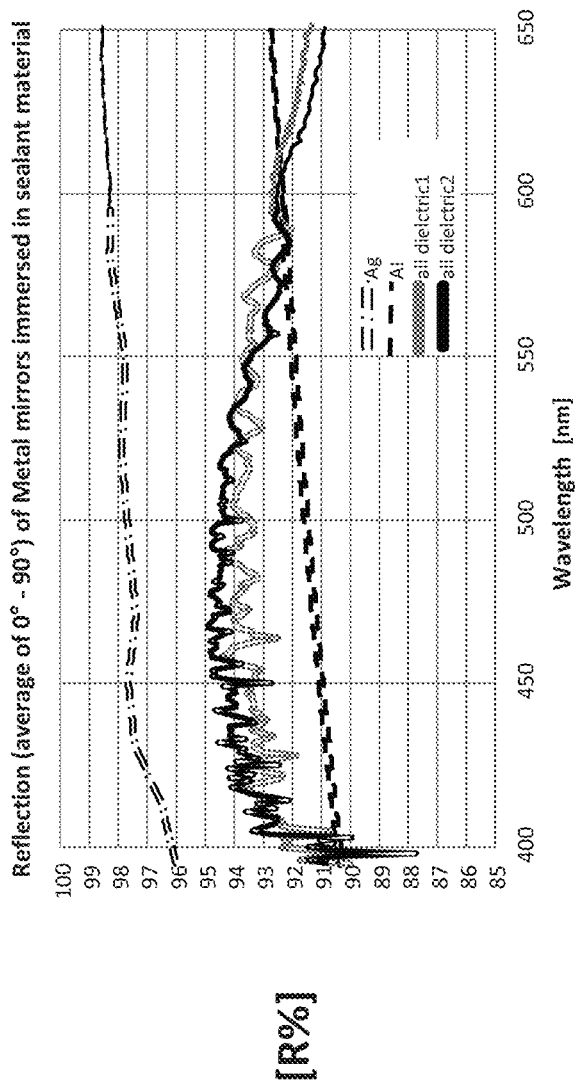
FIG. 8 is a plot of average reflectance over a range of angles of incidence vs wavelength comparing metallic reflectors, e.g. silver and aluminum, to the all dielectric reflectors in accordance with the present invention.
Figure 9:
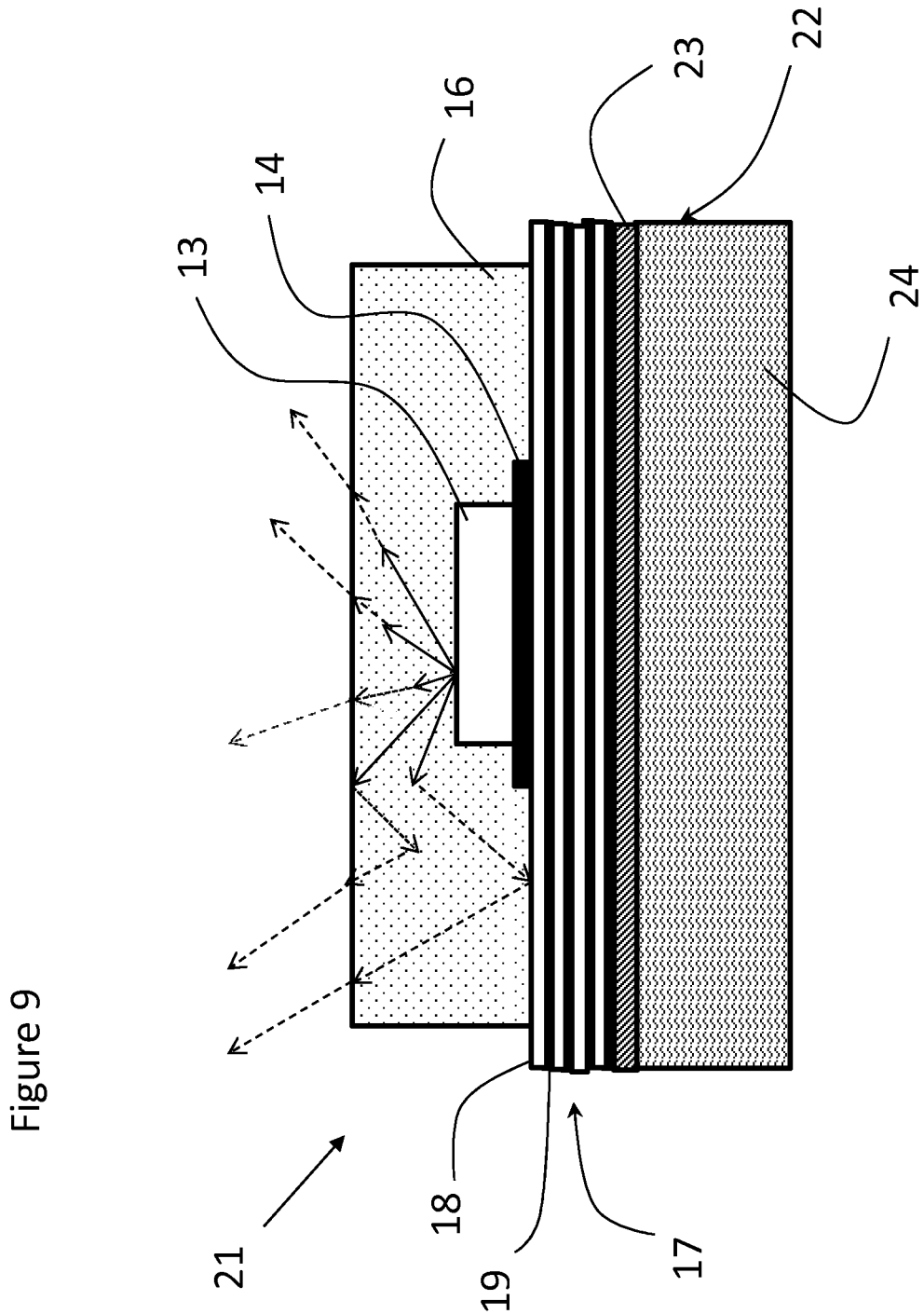
FIG. 9 is a cross-section view of an LED device in accordance with an alternative embodiment of the present invention.
Figure 10:
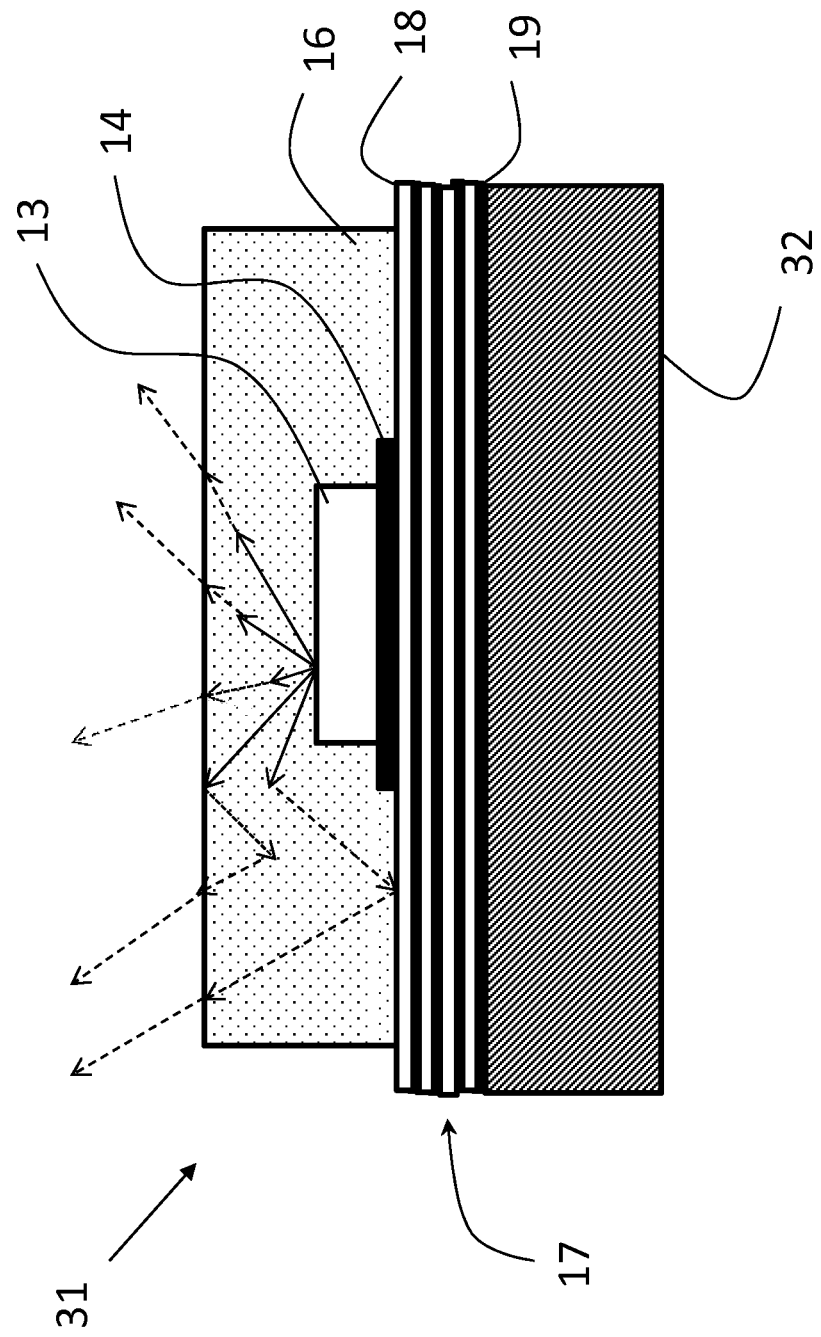
FIG. 10 is a cross-sectional view of an LED device in accordance with an alternative embodiment of the present invention.
Figure 11:
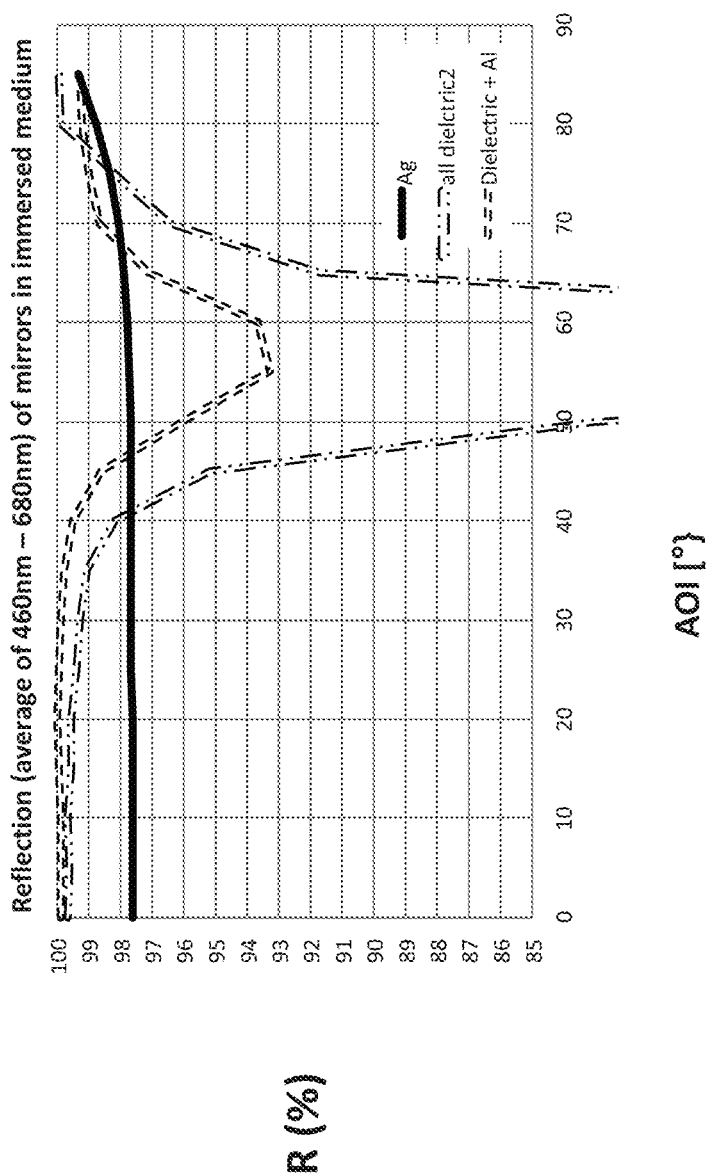
FIG. 11 is a plot of average reflectance over a range of 400 nm to 680 nm vs angle of incidence comparing metallic reflectors, e.g. silver, to the all dielectric reflector in accordance with the second embodiment of present invention, and the combination of the all dielectric reflector in accordance with the second embodiment of the present invention with an aluminum reflector layer.
Figure 12:
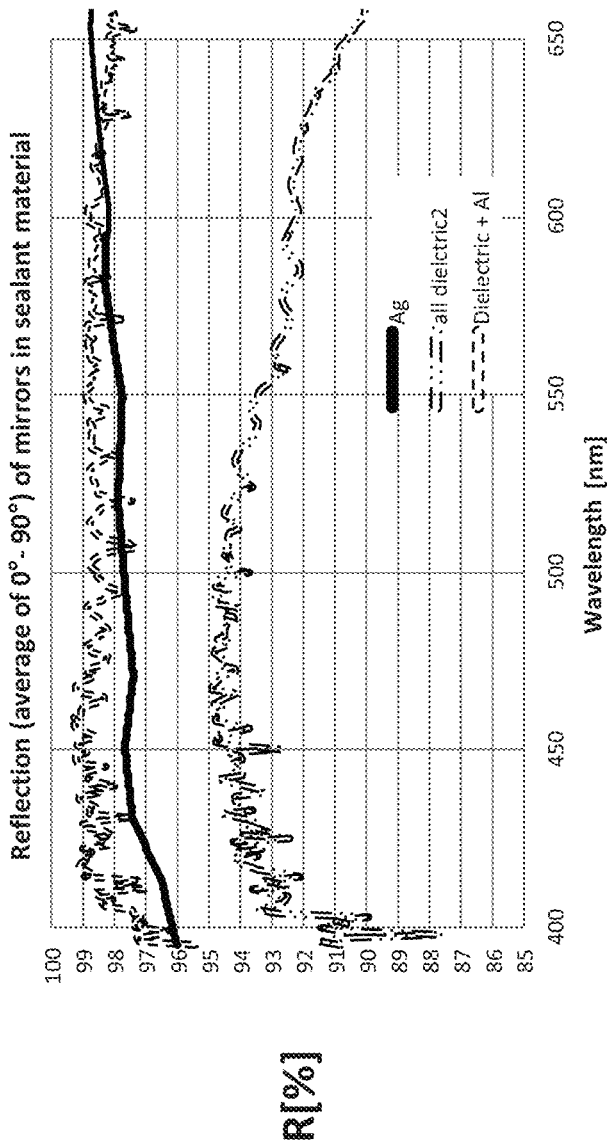
FIG. 12 is a plot of average reflectance over a range of angles of incidence vs wavelength comparing metallic reflectors, e.g. silver, to the all dielectric reflector in accordance with the second embodiment of present invention, and the combination of the all dielectric reflector in accordance with the second embodiment of the present invention with an aluminum reflector layer.

With reference to FIG. 8, as a result of the Brewster phenomenon, the average reflection of the dielectric stack 17 in accordance with either of the aforementioned embodiments, across the visible spectrum (400 nm to 650 nm) and over an angle of incidence range of 0° to 90°, is reduced to approximately 93%, as compared to 97.9% for silver and 91.9% for aluminum. A solution to the aforementioned problem, without sacrificing durability, is illustrated in FIG. 9, in which an LED device 21, having all of the same elements as the LED device 11, also includes a durable metallic reflector layer 22, e.g. comprised of aluminum, between the dielectric stack 17 and the substrate 12. The metallic reflective layer 22 can be as thin as 10 nm to 500 nm, but for practical purposes the layer 22 is typically between 35 nm and 120 nm and ideally between 50 nm and 70 nm, depending upon the thickness requirements of the LED device 21. With reference to FIG. 10, an LED device 31 is illustrated, in which the entire substrate is comprised of a reflective metallic material, ideally aluminum, to provide the additional reflectivity required, as well as to provide increased heat dissipation. A material having a thermal conductivity of greater than 100 W/mK, while a material with a thermal conductivity of greater than 200 W/mK, e.g. Al k=250 W/mK, is more preferred. All the other elements, i.e. LED 13, electronic circuitry 14, sealing material 16, and dielectric stack 17 are the same as in FIGS. 2 and 9. FIG. 11 illustrates how the lowest reflectivity for the combined dielectric stack/metallic reflector is over 93%, and FIG. 12 illustrates that the average reflectivity of the combined reflector is over 98.5% over the entire visible spectrum, which is greater than either a silver reflector or the dielectric stack 17.

Another advantage to the combined reflector is that the thickness of the dielectric stack 17 can be substantially reduced to between 3 μm and 6 μm, by reducing the number of layers per section, without sacrificing too much performance in reflectivity. The total thickness of the dielectric stack 17 can be in the range of 2 μm to 20 μm, preferably 2.5 μm to 12 μm, and most preferably between 3 μm and 8 μm, providing over 90% reflectivity, preferably over 95% reflectivity, and most preferably over 97% reflectivity for light having a bandwidth over 250 nm, e.g. from 400 nm to 680 nm, at angles of incidence between 0° and 90°.

Reducing the thickness of the dielectric stack 17 can be important when low thermal resistance through the dielectric stack 17 is required to increase heat dissipation away from the LED 13. The table below provides a comparison of average reflectivities for reflector stacks 17 with different thicknesses.

The average reflectivity was calculated over an angle range of 0°-85° and a wavelength range of 400 nm to 680 nm.

| Mirror Thickness (um) | Average Reflectivity (%) |
|---|---|
| 7.60 | 98.5 |
| 4.22 | 98.0 |
| 3.70 | 97.6 |
| 3.11 | 97.4 |
| Silver | 97.8 |

We claim:

1. A light emitting diode (LED) device comprising:
   an LED for emitting light at a first wavelength;
   a substrate comprising a layer of reflective metallic material having a coefficient of thermal conductivity greater than 200 W/mK to increase heat dissipation from the LED;
   electrical circuitry for providing power to the LED from external sources disposed in between the substrate and the LED;
   a wavelength conversion material covering the LED for converting light emitted at the first wavelength to light of at least a second wavelength, which combined with the light of the first wavelength forms a broadband light source; and
   a multi-layer dielectric structure of alternating high and low index material layers in between the substrate and the electrical circuitry providing both electrical insulation for the electrical circuitry's connections and reflectivity for the broadband light source, wherein the multi-layer dielectric structure is between 2 μm and 20 μm thick, and
   wherein the layer of reflective metallic material and the multi-layer dielectric structure provide over 95% average reflectivity for light at wavelengths between 400 nm and 680 nm over an angle of incidence range of 0° to 90°.

2. The device according to claim 1, wherein the multi-layer dielectric structure is a broadband reflector reflecting at least 95% of light over a range of 400 nm to 680 nm.

3. The device according to claim 1, wherein the first and second wavelengths combine to form white light.

4. The device according to claim 1, wherein the wavelength conversion material comprises a plurality of different materials for converting the light emitted at the first wavelength to light at second and third wavelengths, which combine with the first wavelength to form white light.

5. The device according to claim 1, wherein the multi-layer dielectric structure comprises a plurality of sections, each section for reflecting a different bandwidth, defined by a center wavelength, of from 75 nm to 125 nm each, each section comprising a plurality of alternating high and low index layers, each layer having an optical width approximately a quarter of the center wavelength.

6. The device according to claim 1, wherein the multi-layer dielectric structure comprises a plurality of pairs of high and low index material layers, each pair for reflecting a different bandwidth of from 5 nm to 15 nm, defined by a center wavelength, each layer having an optical width approximately a quarter of the center wavelength.

7. The device according to claim 1, further comprising a sealant material in which the wavelength conversion material is dispersed; wherein the sealant material is transparent to the first and second wavelengths of light.

8. The device according to claim 7, wherein the transparent sealant material comprises one or more materials selected from the group consisting of silicone, epoxy, glass, plastic, and polymer.

9. The device according to claim 1, wherein the substrate comprises a reflective metallic material.

10. The device according to claim 1, wherein the substrate comprises aluminum.

11. The device according to claim 1, wherein the multi-layer dielectric structure is between 3 μm and 8 μm thick.

* * * * *